United States Patent [19]

Winkelstein

[11] Patent Number: 5,025,402

[45] Date of Patent: Jun. 18, 1991

[54] METHOD OF TRANSIENT SIMULATION OF TRANSMISSION LINE NETWORKS USING A CIRCUIT SIMULATOR

[75] Inventor: Dan Winkelstein, Raleigh, N.C.

[73] Assignee: Northern Telecom Limited, Montreal, Canada

[21] Appl. No.: 334,325

[22] Filed: Apr. 7, 1989

[51] Int. Cl.$^5$ .............................................. G06F 15/31
[52] U.S. Cl. ................................................... 364/578
[58] Field of Search ...................... 364/200, 900, 578

[56] References Cited

U.S. PATENT DOCUMENTS 4,791,593 12/1988 Hennion .............................. 364/578
4,918,643 4/1990 Wong .............................. 364/578 X
4,939,681 7/1990 Yokomizo et al. ................. 364/578

OTHER PUBLICATIONS

Analysis of Lossy Transmission Lines with Arbitrary Nonlinear Terminal Networks, IEEE Transactions on Microwave Theory and Techniques, vol. MTT-34, No. 6, Jun. 6, 1986, pp. 660-664, Antonije R. Djordjevic et al.

Primary Examiner—Thomas M. Heckler
Attorney, Agent, or Firm—Foley & Lardner

[57] ABSTRACT

The disclosure is a technique to describe a complex coupled multi-port transmission line system in terms of a time-domain Green's function and then implement this description into a circuit simulator. This permits highly accurate simulation of arbitrary transmission line networks with non-linear transistor level models of digital devices and avoids reliance on non-physical approximations of the behavior of the transmission line or digital device termination. The method is particularly applicable to digital systems which experience transmission line effects of printed circuit board tracks.

12 Claims, 10 Drawing Sheets

-40.000 ns    60.000 ns    160.000 ns

-40.000 ns    60.000 ns    160.000 ns

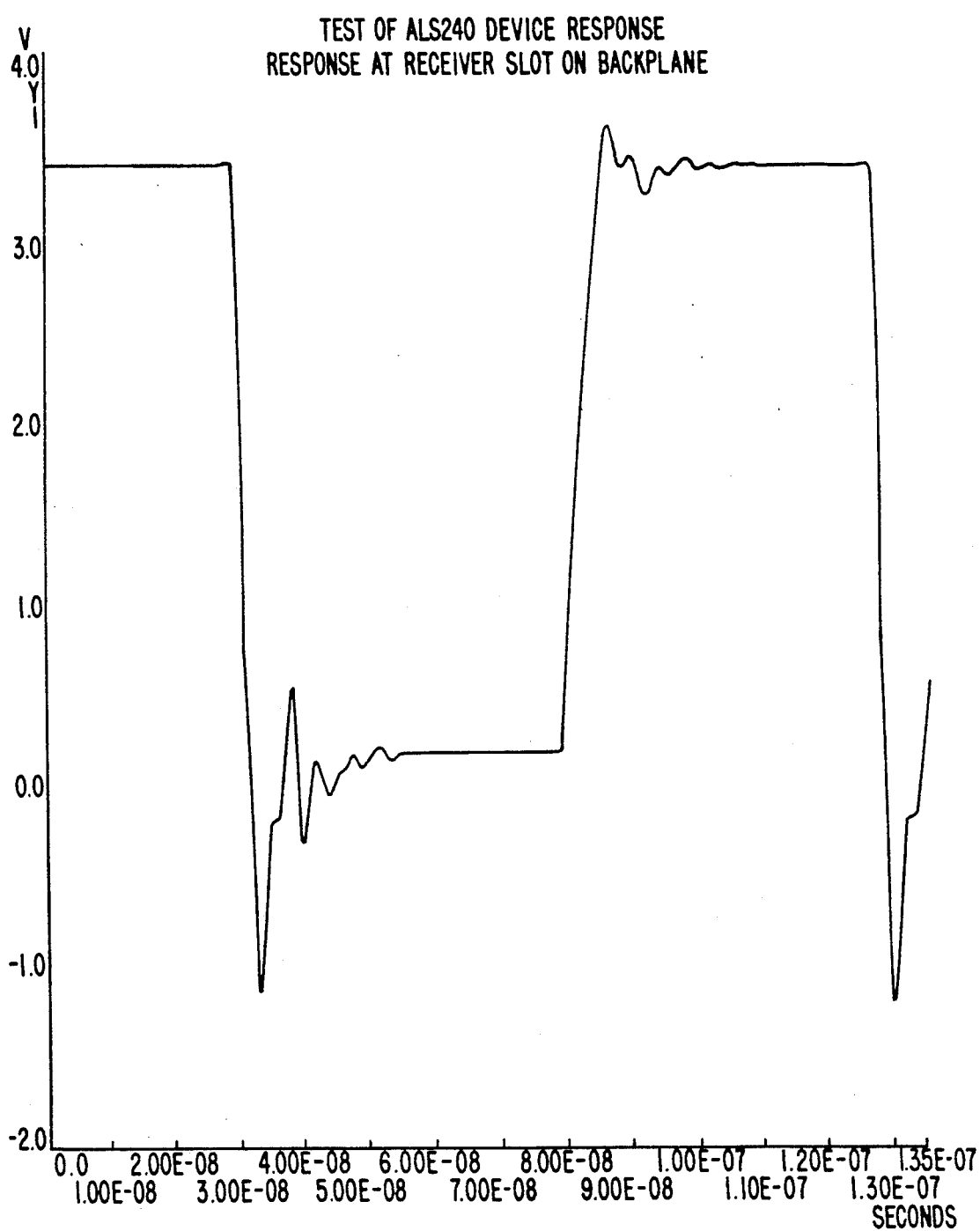

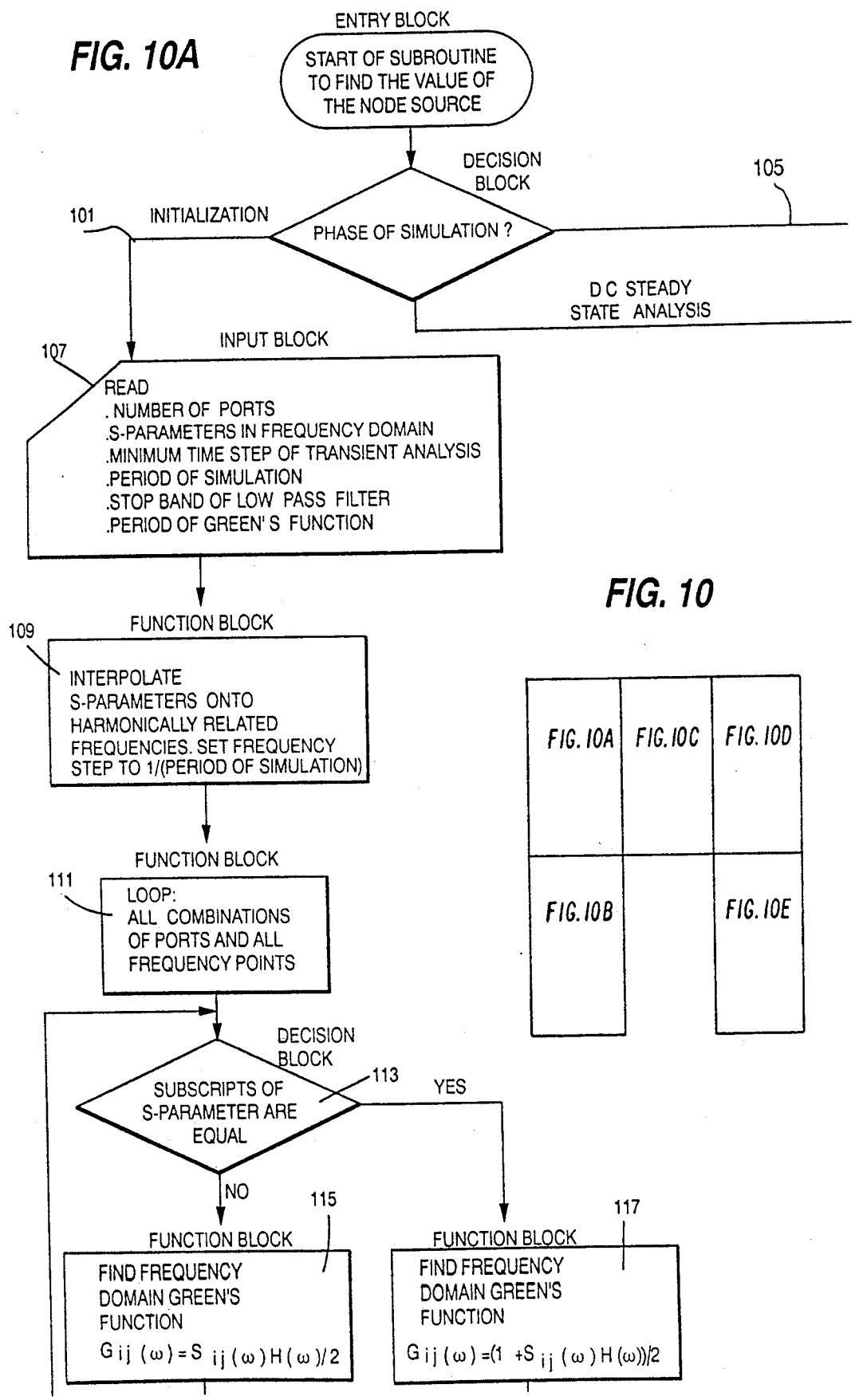

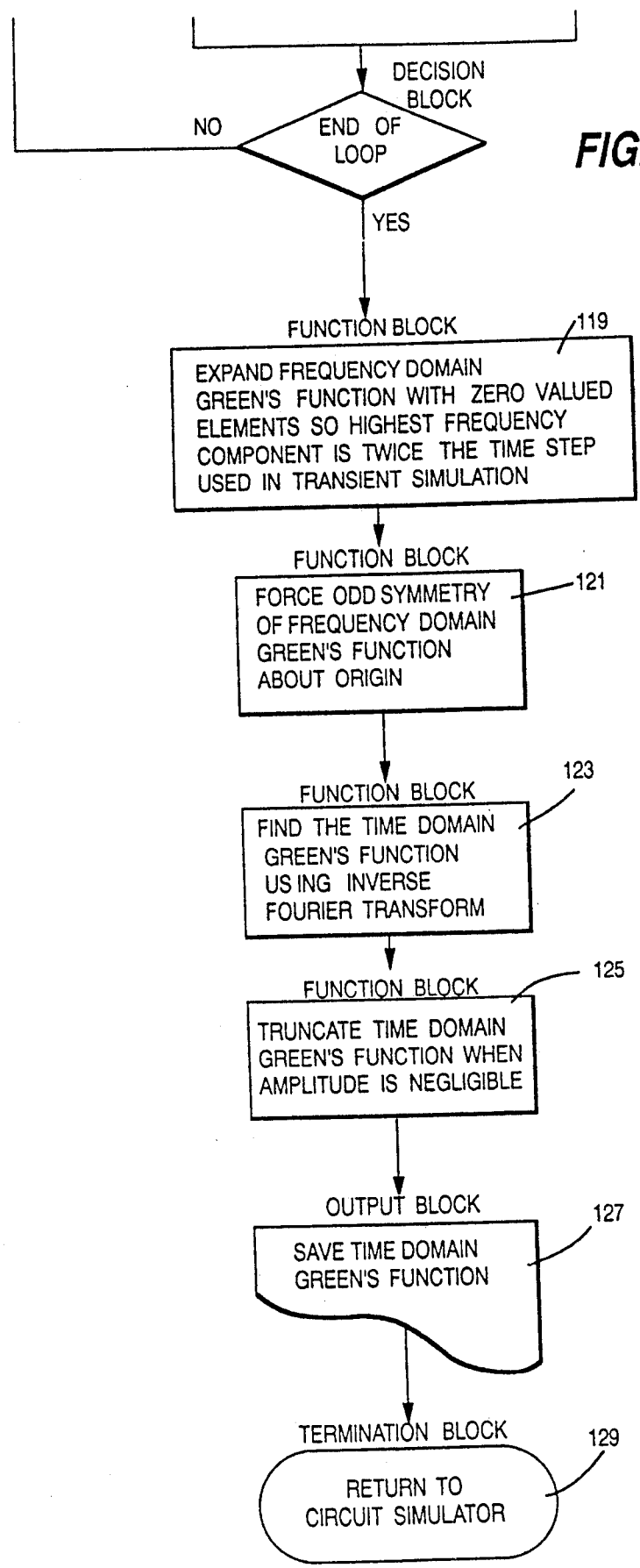

METHOD OF TRANSIENT SIMULATION OF TRANSMISSION LINE NETWORKS USING A CIRCUIT SIMULATOR

BACKGROUND OF THE INVENTION

1. Field of the Invention

The invention deals with determining expected effects of transmission line systems.

2. Related Art

The speed in which digital systems can operate is often constrained by the transmission line effects of the printed circuit board (PCB) tracking. Since simulation techniques have not kept pace with advances in device switching speed, a designer may not be able to predict errors introduced by transmission line effects until a PCB has been prototyped. Furthermore, as time-to-market requirements are compressed, a designer is forced rely on simulations, as opposed to prototyping, to prove the functionality and robustness of a design. Therefore, in order to properly assess the impact of transmission line effects on digital system performance, simulation tools require an accurate method to incorporate such transmission line effects.

Previous techniques used in circuit simulators, for simulating transmission line effects for digital systems on PCBs, rely on non-physical approximations of the characteristics of either the digital devices or the transmission line network. For analog circuit simulators, such as SPICE, simulations can either be performed in the time domain or in the frequency domain. If the simulations are performed in the frequency domain, the transmission line system may be accurately described from measured Scattering (S)-parameters. However, linear approximations must be made for the termination characteristics of non-linear digital devices. If the simulations are performed in the time domain, the digital devices can be accurately described by transistor level models. However, the transmission line system must be approximated by either lumped elements or lossless delay line models.

Previous techniques used in circuit simulators for predicting the transmission line effects on PCBs with digital device termination have classically used one of the following methods. All of the these methods require non-physical approximations to the characteristics of either the transmission line system or the termination.

1) Modelling the transmission line effects of a PCB layout as a set of lumped element (L,R,C,G) subcircuits and simulating these circuits with nonlinear digital device terminations in the time domain.

2) Modelling the transmission line effects of a PCB layout as a set of lossless bi-directional delay lines and simulating with non-linear digital device terminations in the time domain.

3) Describing the transmission line effects of a PCB layout by the frequency domain S-parameters and simulating with linear approximations to digital device models in the frequency domain.

Lumped element models for transmission lines are only accurate for short electrical lengths at low frequencies. Multiple lumped element subcircuits are typically required in order to model delay. This technique tends to increase the both the cumulative errors and the simulation time of a circuit simulation due to the addition of multiple reactive elements.

Bi-directional delay line models for the transmission line effects of a PCB layout provide a significant improvement in accuracy at moderate frequencies over lumped parameter models. Unfortunately, a delay line cannot model discontinuities or any lossy or dispersive characteristics of a PCB. This is because the delay line models are based on infinitely long and straight transmission lines with no impedance discontinuities. In addition, depending on the implementation, there can be significant numerical convergence problems and accumulated numerical noise with this method.

Frequency domain solutions with an S-parameter description of the PCB layout provide very accurate solution of transmission line effects. However, linearization is a poor approximation for the termination characteristics of digital devices. Thus, frequency domain simulation does not return accurate results for digital systems.

SUMMARY OF THE INVENTION

In view of the foregoing it is an object of the invention to simulate a complex transmission line system with non-linear terminations in the time domain.

It is a further object of the invention to predict the effect transmission line systems have on the signal quality and signal integrity for a system in which the terminating devices exhibit nonlinear impedance characteristics.

It is a further object of the invention to use a general purpose circuit simulator to describe a system containing transmission lines and devices exhibiting nonlinear impedance characteristics in order to perform a time domain analysis by calling a subroutine to model the effects of the transmission line network.

It is a further object of the invention to derive a time domain Green's function from a frequency domain S-parameter description of a complex coupled transmission line system.

It is a further object of the invention to incorporate the Green's function into the simulator.

The above objects of the invention are accomplished by a technique to derive a time domain Green's function from a frequency domain S-parameter description of a complex coupled transmission line system. The Green's function is then incorporated into a circuit simulator, such as SCAMPER ™, a proprietary analog circuit simulator of Northern Telecom Ltd. It is noted that any circuit simulator which can branch to a subroutine for evaluation of nonlinear controlled voltage or current sources can be used. Using such simulators, accurate simulations can be made for complex transmission line networks terminated with transistor level models of digital devices. This technique has proven to be more accurate and robust than previously reported simulation methods.

By using this technique a designer can simulate a complex transmission line system with arbitrary non-linear termination in the time domain. For example, a designer can predict the effect PCB tracking will have on the signal quality and signal integrity for a digital system.

BRIEF DESCRIPTION OF THE DRAWINGS

FIG. 8 shows a simulated response at the receiver side of the transmission line system.

DETAILED DESCRIPTION OF THE PREFERRED EMBODIMENTS

For any linear system, the response at an observation point can be found by the method of Green's function. The theory of Green's function states that the total response of a system at some observation point to an arbitrary source can be determined by a convolution of that source with its corresponding Green's function over the variable of interest. For a transmission line system the variable of interest is time and the convolution is over a given period of time.

For any linear system with multiple arbitrary sources, the total response at an observation point is found by superposition of the convolution of each source with it's corresponding Green's function.

Figure 1:
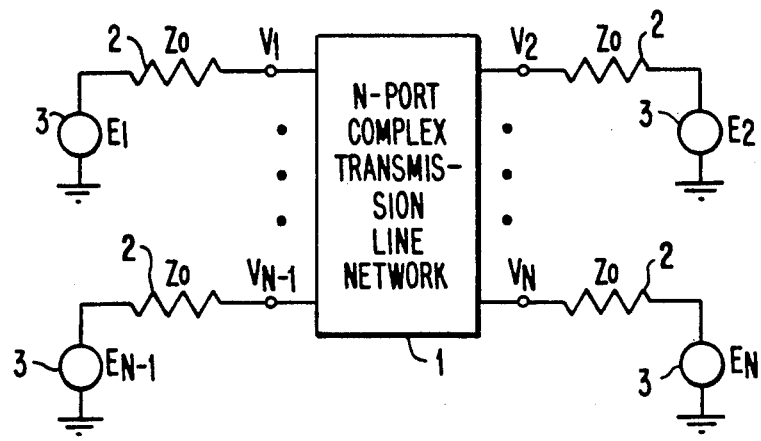
FIG. 1 shows an N-Port system with known reference impedance and arbitrary sources.

The Green's function is the response of the system at the observation point to a Dirac (unit) delta source. The Green's function may also referred to as the time domain impulse response. FIG. 1 illustrates a transmission line network 1 with known reference impedances 2 and arbitrary sources 3.

For the network shown in FIG. 1 the response at each node of the transmission line system is found by linear superposition of the convolution of the Green's function with the arbitrary source. Thus the response at port j and time t is found from the following equations:

$$v_j(t) = \sum_{i=1}^{Nport} \int_{-\infty}^{t} g_{ij}(t-\tau)E_i(\tau)d\tau = \sum_{i=1}^{Nport} g_{ij}*E_i \quad (1)$$

where the * nomenclature signifies a convolution. The terms $g_{ij}()$ refers to the time domain Green's function for the response at port j and time t to a unit delta source at port i and time zero. The term $E_i$ is the arbitrary EMF source at port i with an impedance of Zref. The term Nport refers to the number of ports of the transmission line system.

The Green's function or impulse response may be found from the system Scattering parameters according to the following formula. Scattering parameters are associated with a known reference impedance, usually 50Ω.

$$G_{ij}(\omega) = \begin{cases} (1 + S_{ij}(\omega))H(\omega)/2 & i = j \\ (S_{ij}(\omega))H(\omega)/2 & i \neq j \end{cases} \quad (2)$$

$$g_{ij}(t) = \frac{1}{\Delta t} F^{-1}[G_{ij}(\omega)] \quad (3)$$

The term $G_{ij}(\omega)$ is the frequency domain Green's function. The function $F^{-1}[]$ is the inverse discrete Fourier transform, $S_{ij}(\omega)$ is the frequency domain scattering parameters at radian frequency $\omega$. Finally, $\Delta t$ is the time step used in the numerical convolution. The factor of ½ is derived from flow graph analysis.

The low pass filter, $H(\omega)$, is required to reduce time domain ripple associated with taking the inverse Fourier transform. The amplitude of all elements of the frequency domain Green's function for most transmission line systems does not exhibit rolloff characteristics as frequency increases. Without a low pass filter, the time domain Green's function will exhibit non-negligible time domain ripple. Ripple can be described as an aliasing effect due to bandlimiting of the S-parameters. The effect of the low pass filter is to greatly reduce the amplitude of the ripple.

The low pass filter must be chosen such that the passband includes all harmonics contained in the system response. However, the band reject region must be large enough to attenuate the ripple in the time domain. A side product of this filtering; however, is that the impulse response widens in time. Widening of the impulse response manifests itself as additional loss characteristics when the Green's function is used in a convolution.

Since the time domain Green's function is found using a discrete Fourier transform, the time step and period is dictated by the Nyquist Theorem. The time step, $\Delta t$, is a function of the highest frequency component of the frequency domain Green's function as shown in equation (4) below.

$$\Delta t = \frac{1}{2*\text{Highest frequency component of the frequency domain Green's function}} \quad (4)$$

When the Green's function is used in a circuit simulator, the time step required for convergence of the nonlinear equations may be smaller than the time step dictated by the highest frequency component of the frequency domain Green's function. Since the simulation bandwidth is determined by the passband of the low pass filter, a decrease in the time step can be accomplished by appending zero amplitude frequency components at the high frequency end of frequency domain Green's function. By appending these components, the bandwidth of the Green's function can be arbitrarily extended without affecting the low frequency response.

The time domain Green's function repeats at regular intervals called periods. The period of repetition is a function of the frequency step, $\Delta f$, of the frequency domain Green's function as shown in equation (5). We use the nomenclature T to denote this period.

$$T = \frac{1}{\Delta f} \quad (5)$$

Since the time domain Green's function is time limited, once this function is found it must be windowed to remove repeated or aliased responses.

As so far described, the system response has been determined by a superposition of integrals. For implementation into a computer, we use Simpson's rule to approximate the integration numerically. Thus equation 1 can be approximated as:

$$v_j(q) = \sum_{i=1}^{Nport} g_{ij} * E_i \approx \sum_{i=1}^{Nport} \left[ \sum_{p=-\infty}^{q} g_{ij}(q-p) E_i(p) \Delta t \right] \quad (6)$$

Figure 2:
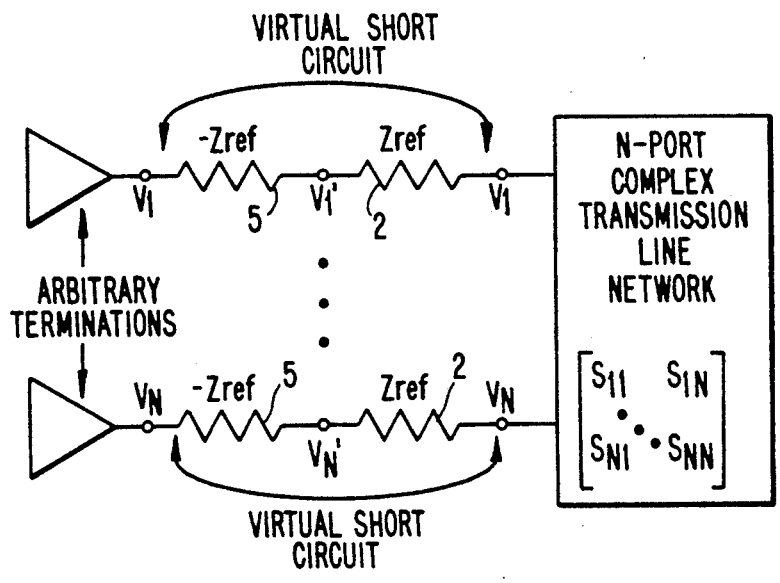
FIG. 2 shows the effect of removing the reference impedance.

To find the system response with an arbitrary impedance at each node of the transmission line system we must remove the reference impedance. A simple mathematical method to remove the effects of the reference impedance is to place a negative impedance 5 of the same value in series with the reference impedance 6. This creates a virtual short circuit between the arbitrary termination and the transmission line system as shown in FIG. 2. This method was first developed by Djordjevic, Sarkar, and Harrington and was described in *Analysis of Lossy Transmission Lines with Arbitrary Non-Linear Termination Networks*, IEEE Transactions on Microwave Theory and Techniques, Vol. 34, No. 6, June, 1986.

By using the compensation theorem an arbitrary network can be subdivided into an N-port transmission line network and N-arbitrary termination systems. Since the transmission line system can be completely separated from the termination, a circuit simulator branch statement can be developed. This branch statement thus describes the behavior of the transmission line at each node based on the past and present voltages and currents at all nodes.

Figure 3:
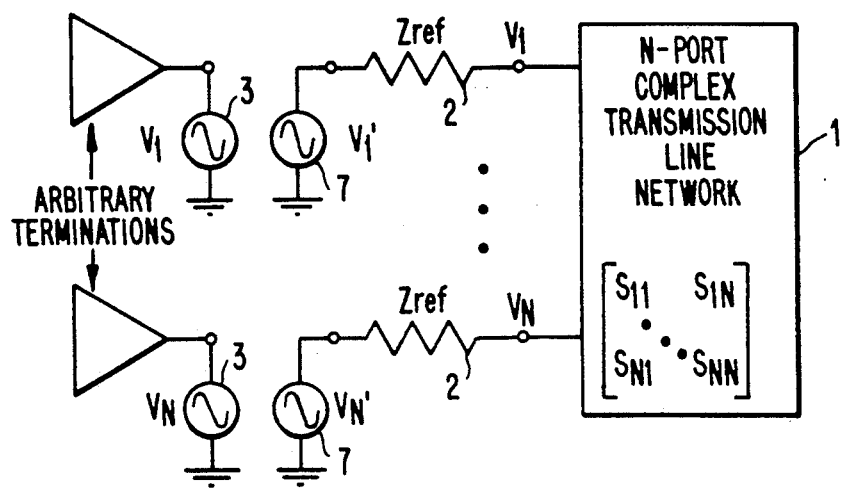
FIG. 3 shows a transmission line network separated from the terminations.

FIGS. 3 illustrates the system that is implemented into the circuit simulator and is electrically identical to FIG. 2.

From FIG. 2 and equation 1, the sources labeled $V_i$ and $V_i'$, are controlled sources at each node. The controlled source $V_i$, referred to as a node voltage, is found from the convolution equation:

$$V_j(t) = \sum_{i=j}^{Nport} g_{ij} * V_i' \quad (7)$$

and the controlled source $V_i'$, referred to as a virtual source, is found from the compensation theorem $$V_i' = V_i + Zref * I_i \quad (8)$$

where $I_i$ is the current flowing out of the arbitrary impedance 7 and $V_j$ is the node voltage.

Therefore for an N-port transmission line system there exists 2N equations with 2N unknowns. These equations can be solved by the general purpose circuit simulator using a numerical technique.

Figure 4:
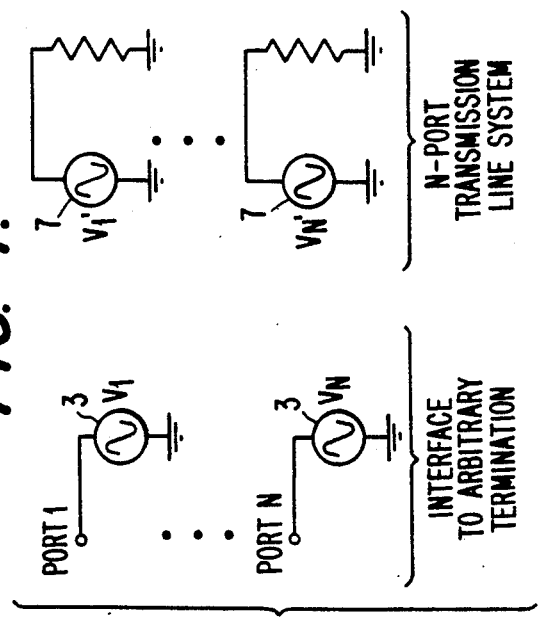
FIG. 4 shows an implementation into a general purpose circuit simulator.

To implement the Green's function approach to simulating transmission line systems in a general purpose circuit simulator, a transmission line model is defined. This model contains two controlled voltage sources for each port of the transmission line system. One of these sources is the virtual source. The voltage across the virtual source is defined by equation 8. The other source is the node source. This source is defined by equation 7. FIG. 4 illustrates the implementation for an N-port transmission line system. The resistors shown in this figure are only for DC connectivity and do not effect the operation of the model.

A linear branch statement can be used for the virtual source. The node source, however, is defined by nonlinear branch statements. To implement a nonlinear branch statement the general purpose circuit simulator must permit a user to define a FORTRAN subroutine to perform the necessary computations.

There are three phases to the time domain simulation: initialization 101, DC steady state analysis 103, and transient analysis 105.

Initialization

During initialization the general purpose circuit simulator passes the following user supplied information to the subroutine:
  number of ports for the transmission line network,
  scattering parameters in the frequency domain for the network,
  minimum time step used in transient analysis,
  period of time the simulation is performed,
  stop band frequency for the low pass filter,
  period of time the Green,s function is expected to have non-negligible components.

Upon initial entry, the subroutine uses the following steps to find the time domain Green's function from the frequency domain S-parameters.

1) The complex frequency domain S-parameters are read at 107 and interpolated onto other frequencies, such as harmonically related frequencies, as shown in function block 109. The frequencies are required for the inverse Fast Fourier Transform (FFT) algorithm.

2) As shown by loop function block 111, decision block 113 and function blocks 115 and 117, the frequency domain Green's function is found using equation 2 for all combinations of ports and all frequency points. The low pass filter used has a pass band as specified by the user.

3) As shown by function block 119, the frequency domain Green's function is extended by addition of zero value elements so that the highest frequency component has a corresponding time step equal to the minimum time step used in transient simulation.

4) As shown in function blocks 121 and 123, the time domain Green's function is found using an inverse FFT. Since the time domain Green's function is a real function, the imaginary components of the frequency domain Green's function are forced to have odd symmetry around the frequency origin before the inverse Fourier transform is taken.

5) In function block 125, the time domain Green's function is truncated when the Green's function response has a negligible amplitude.

These steps are repeated for each of the $N^2$ Green's functions. The time domain Green's function is saved as shown in function block 127 and as shown in termination block 129, control is returned to the simulator program.

DC Steady State Analysis

During DC steady state analysis 103, the general purpose circuit simulator finds a steady state voltage at each node of the system. This means the simulator attempts to converge to a solution at time $t=0$. Thus, as shown in function blocks 131, 133 and 135, the time domain Green's function is recalled, the number of ports and time step read and the virtual source voltages at $t=0$ are read.

In order to evaluate the summation of equation 2 it is assumed that all transients will die out within the time period T, dictated by equation 5. Assuming a steady state condition from time $t=\infty$ to $t=0$ a circular convolution can be used to evaluate equation 7. Thus, as shown in function block 137, the superposition of convolution equations used to find the node voltages is approximated during DC analysis by the following:

$$V_j(0) \approx \sum_{i=1}^{Nport} \left[ \sum_{p=T}^{0} g_{ij}(-p)V'_i(0)\Delta t \right] \quad (9)$$

During DC analysis the general purpose circuit simulator passes the present time (zero) and, as shown in function block 135, the voltage at each virtual source, $V'_i(0)$. The subroutine returns the node voltage for all node sources, as shown in function block 139. The simulator uses this information as part of the numerical analysis to converge to a steady state voltage for all nodes in a system. Control is returned to the simulator, as shown in function block 141.

Transient Analysis

During transient analysis 105, the subroutine uses a circular convolution to find the node voltages. As shown in function blocks 143, 145, 147, 149, the simulator passes the present simulation time and voltage at each virtual source to the subroutine. In loop 151 the voltages at all virtual sources are interpolated to fit the time step of the Green's function according to function block 153.

Function block 155 shows that the circular convolution used for time q and period T is defined by the following:

$$V_j(q) \approx \sum_{i=1}^{Nport} \left[ \sum_{p=0}^{q} g_{ij}(q-p)V'_i(p)\Delta t + \sum_{p=q-T}^{-1} g_{ij}(-p)V'_i(0)\Delta t \right] \quad (10)$$

The use of the circular convolution represents the sum of the transient and steady state response of the system. The first term in the brackets of equation 9 is the transient response, while the second term is the steady state response. The node source voltage is returned in output block 157 and control is returned to the simulator in termination block 159.

To prove this method of circuit simulation produced accurate results, a simulation was compared against oscilloscope measurements for a PCB layout with digital devices. The S-parameters for the layout were obtained from field theory models using a frequency domain circuit simulation program. The digital device models were obtained from transistor level models supplied by the manufacturer. This comparison ensured the tool provided accurate simulation for use in the design process.

Figure 5:
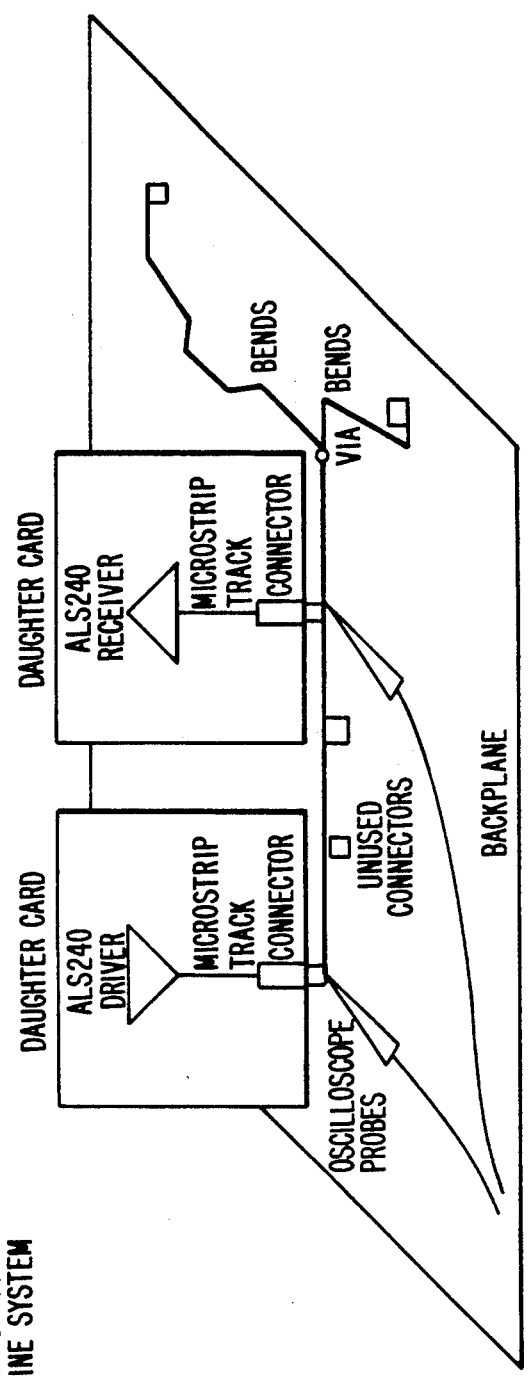
FIG. 5 shows a complex multi-port transmission line system.
Figure 6:
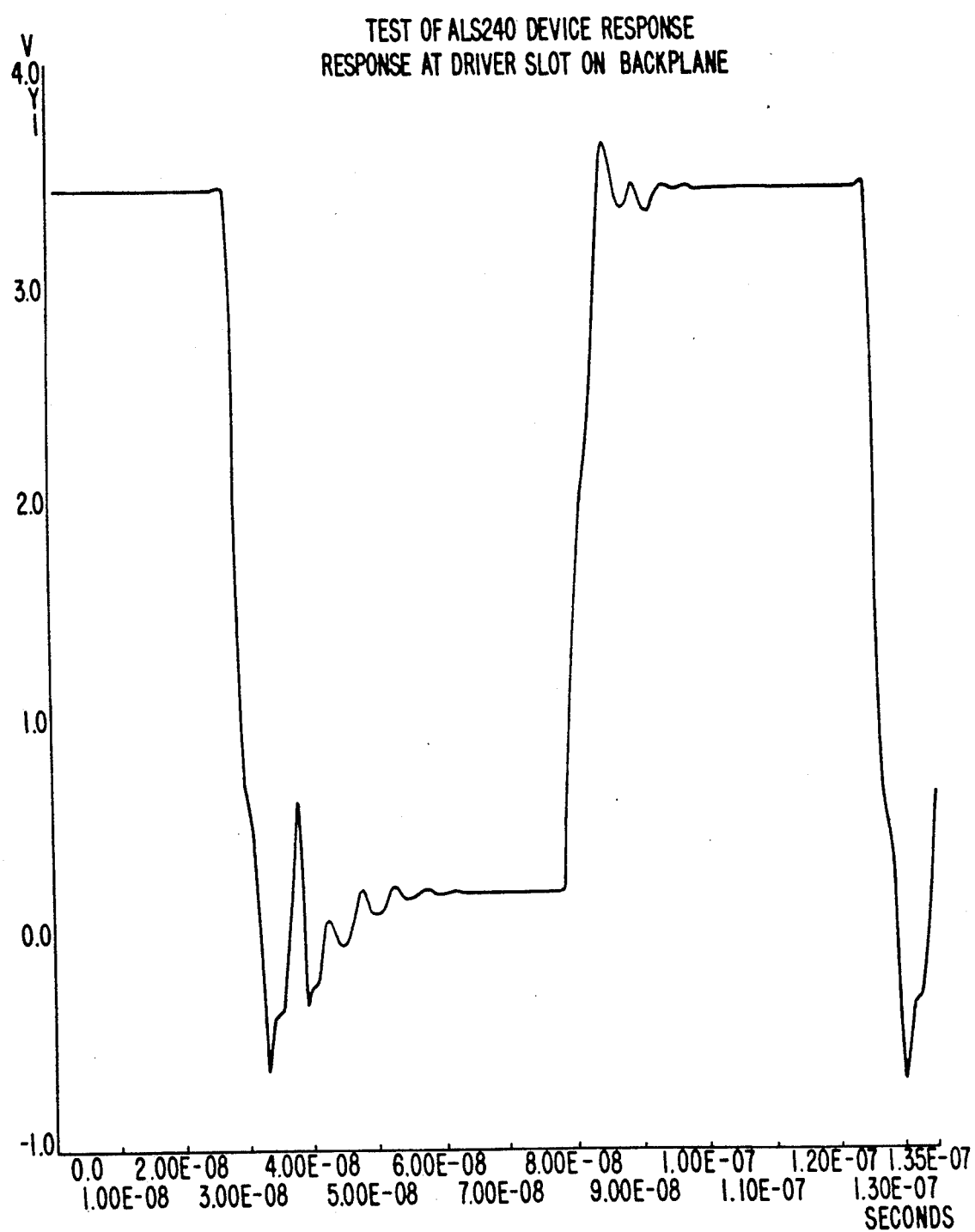
FIG. 6 shows a simulated response at the driver side of the transmission line system.
Figure 7:
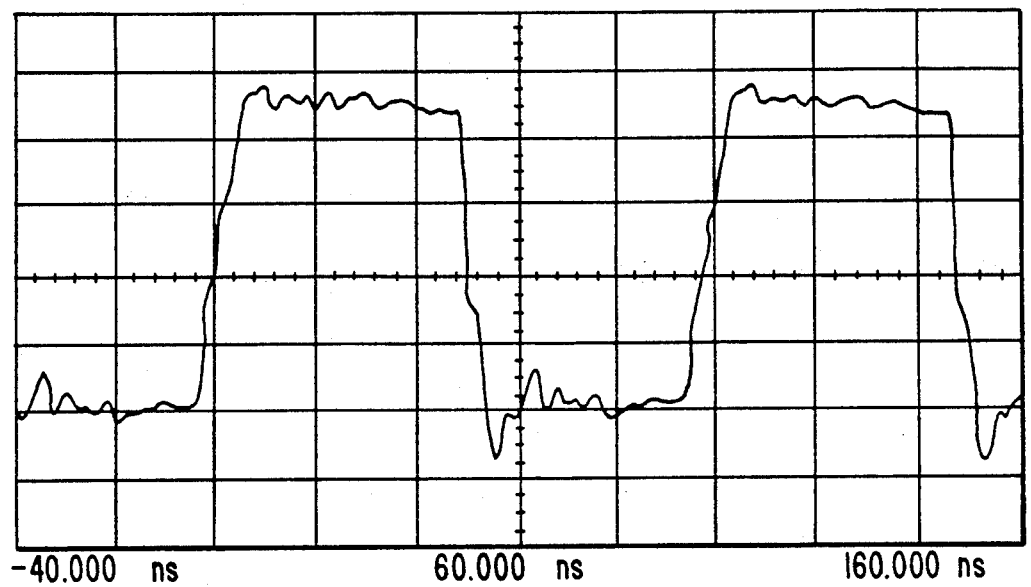
FIG. 7 shows the measured response at the driver side of the transmission line system.
Figure 9:
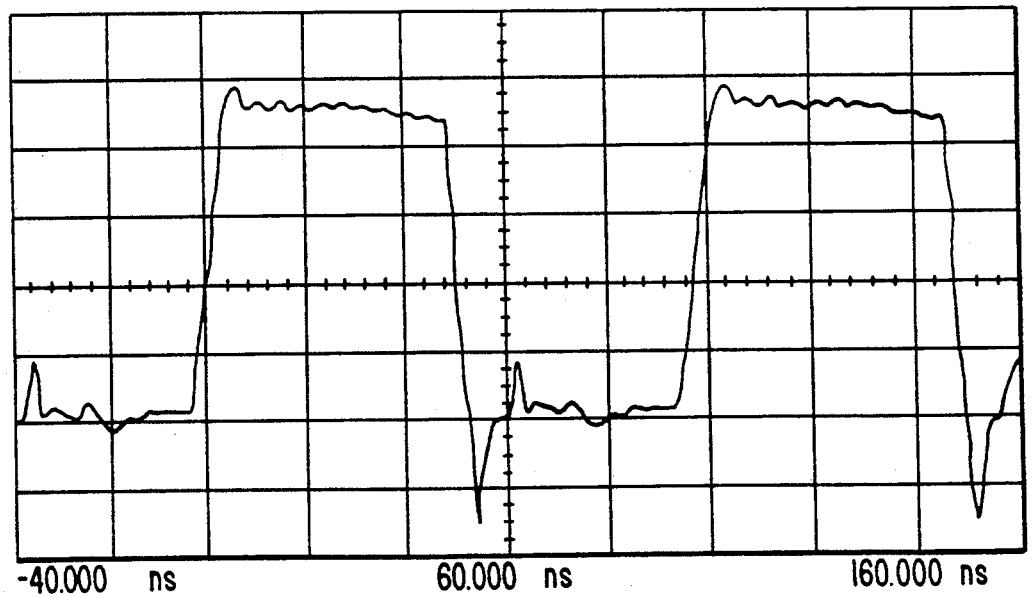
FIG. 9 shows the measured response at the receiver side of the transmission line system.
Figure 10C:
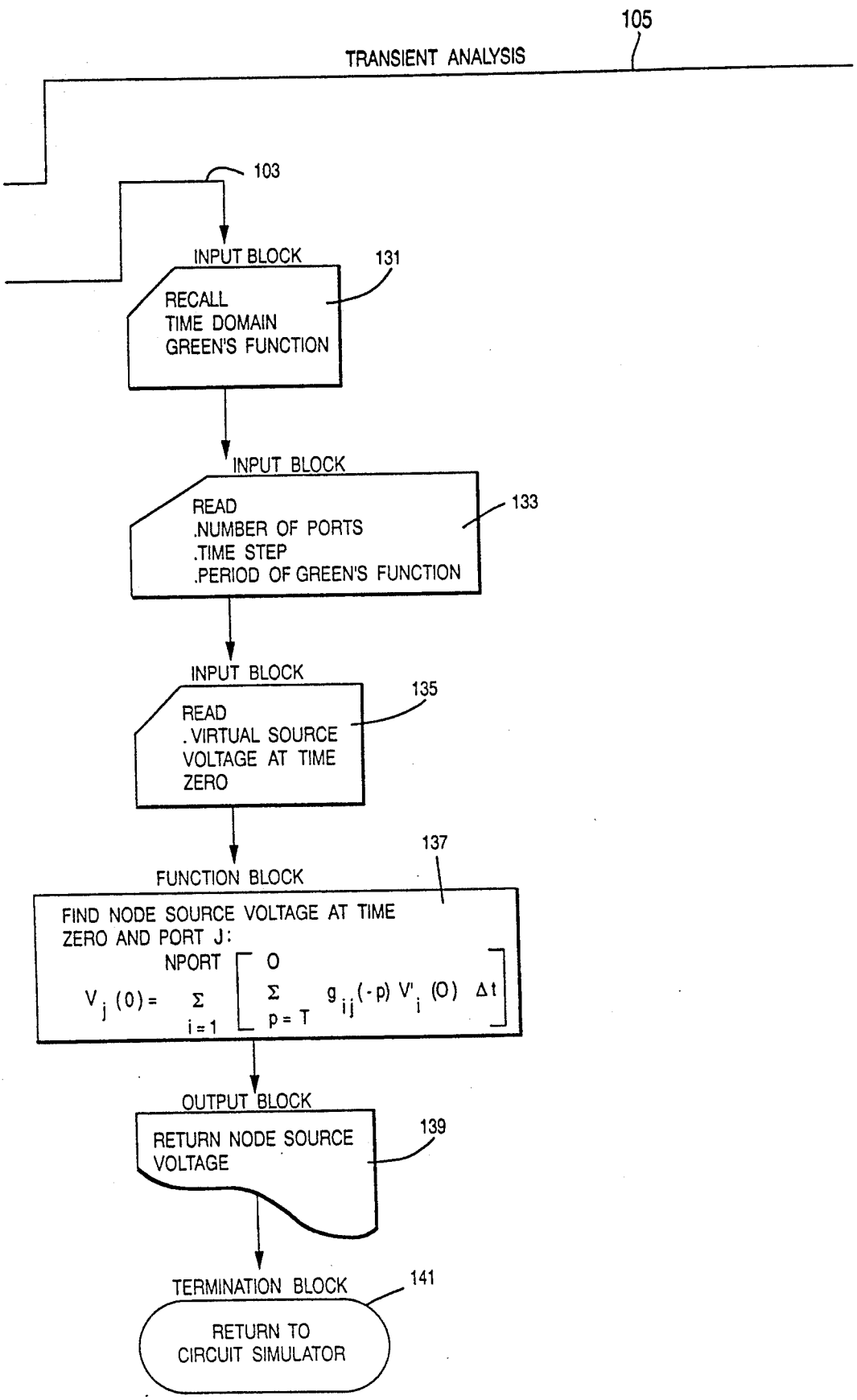
FIG. 10 shows a block diagram of the method.
Figure 10D:
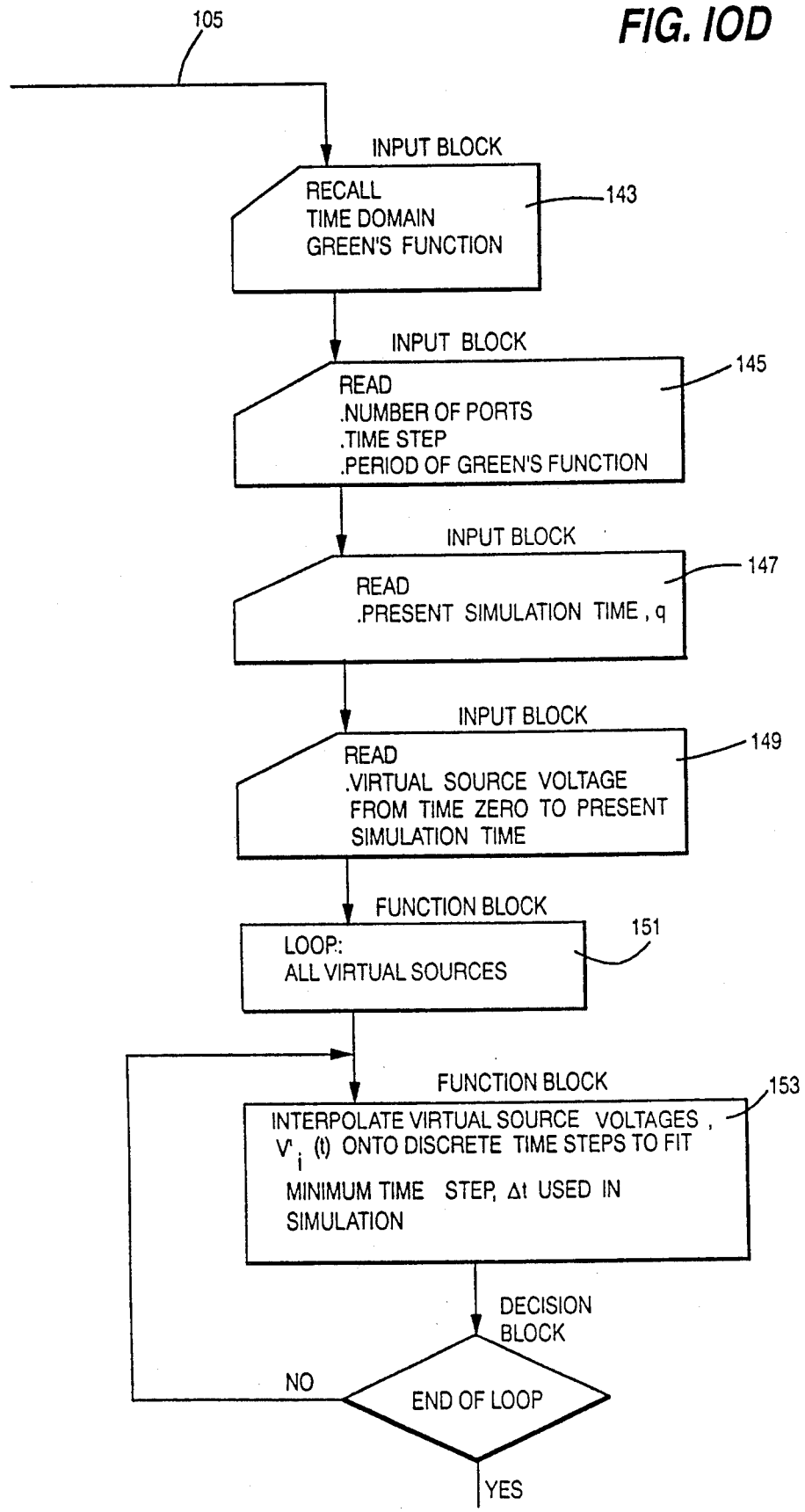
Figure 10E:
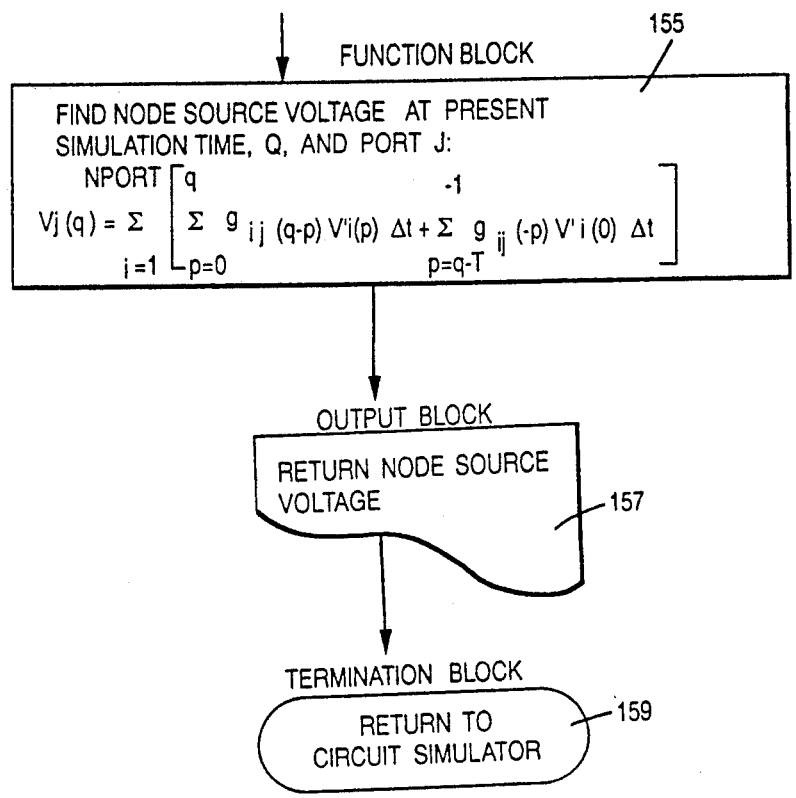

FIG. 5 shows the system tracking for a 4-port complex transmission line network. The four ports are the driver and receiver ports, and the two connections for the oscilloscope probes. FIGS. 6 through 9 compare the measured and simulated responses at the oscilloscope probes.

The experimental verification proved that the technique of simulation using the Green's approach in a circuit simulator could accurately model the transmission line effects. Thus, this method can accurately predict transmission line problems before a PCB is manufactured.

Discrepancies between the simulation results and measured results are due to the following factors.

Inaccuracies in the frequency domain S-parameters caused by approximations in the models for connectors, line, vias, etc.

Inaccuracies in the models for the ALS240 devices. These models were transistor level models supplied by the manufacturer.

Aliasing and other effects caused by taking a discrete inverse Fourier transform of a system that is inherently band-unlimited and continuous.

While several embodiments of the invention have been described, it will be understood that it is capable of still further modifications and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. A method of determining expected performance of a transmission line system comprising the steps of:
    simulating the transmission line system and termination characteristics with a general purpose circuit simulator, the simulator allowing elements represented by a branch statement to be defined by a subroutine;
    determining frequency domain S-parameters of the transmission line system;
    calling from the general purpose circuit simulator a subroutine finding a time domain Green's function from the S-parameter;
    calling from the general purpose circuit simulator a subroutine performing a circular convolution of voltages and currents at sources in the transmission line system with the Green's function providing a steady state voltage value at each port; and
    calling from the general purpose simulator a subroutine convolving the Green's function with present and past port voltages and currents at discrete times to find voltage and current at each port at each discrete time.

2. The method of claim 1 further comprising the step of including branch statements such that a reference impedance associated with the S-parameters can be removed and including branch statements such that the transmission line system can be partitioned into a transmission line network and a termination network at each of a plurality, N, of ports.

3. The method of claim 2 further comprising the steps of:
    representing each arbitrary termination as a controlled source and a virtual source;
    setting a value of the virtual source equal to a value of the controlled source plus the product of the reference impedance and a current flowing out of an arbitrary impedance;
    setting a node voltage at each time equal to a summation over the N ports of a convolution of the time domain Green's function with each virtual source.

4. The method of claim 3 wherein the step of representing each arbitrary termination as a controlled source and a virtual source comprises the steps of:

calling from the general purpose circuit simulator a linear branch statement defining the virtual source; and calling from the general purpose circuit simulator a non-linear branch statement defining a subroutine for computing the node voltage.

5. The method of claim 1 further comprising the step of calling from the general purpose circuit simulator a subroutine to numerically determining a response, $V_j(q)$, based on time increments, $\Delta t$, at each node of an N port transmission line system, by linear superposition of the convolution of the Green's function, $g_{ij}$, with an arbitrary source, E, according to the following equation:

$$V_j(q) = \sum_{i=1}^{Nport} \left[ \sum_{p=\infty}^{q} g_{ij}(q-p) E_i(p) \Delta t \right]$$

6. The method of claim 5 further comprising the step of setting $\Delta 5$ equal to an inverse of two times a highest frequency component of a frequency domain Green's function.

7. The method of claim 1 wherein the step of finding a time domain Green's function further comprises:
   determining a low pass transfer function to include all system response harmonics and to reject ripple;
   determining a frequency domain Green's function by
   (a) for S-parameters having non-equal subscripts adding one (1) to the S-parameters, multiplying by the low pass transfer function and dividing by two;
   (b) for S-parameters having equal subscripts multiplying by the low pass transfer function and dividing by two; and
   taking an inverse discrete Fourier transform and dividing by a time step.

8. The method of claim 1 further comprising the step of modeling a printed circuit board as a transmission line system.

9. The method of claim 1 further comprising the step of modeling termination characteristics of digital devices with non-linear transistor level models from the general purpose circuit simulator.

10. A method of determining expected performance of a transmission line system by simulating the transmission line system and termination characteristics with a general purpose circuit simulator allowing branch statements and subroutines to be called, comprising the steps of:
   (a) performing preliminary processing comprising:
     (i) passing initialization parameters including frequency domain S-parameters of the system, from the circuit simulator to a subroutine;
     (ii) reading the S-parameters into the subroutine and interpolating the S-parameters onto other frequencies;
     (iii) in the subroutine, calculating a frequency domain Green's function and a time domain Green's function;
     (iv) repeating step i through iii in the subroutine for each of $N^2$ Green's function for N nodes;
   (b) performing a numerical analysis to converge on a steady state solution in the general purpose circuit simulator, further comprising the steps of:
     (v) passing time and voltage information from the general purpose circuit simulator to the subroutine;
     (vi) in the subroutine performing superposition of convolutions used to find node voltage, $V_j(0)$ according to:

$$V_j(0) = \sum_{i=1}^{Nport} \sum_{p=T}^{0} g_{ij}(-p) V_i'(0) \Delta t$$

wherein $g_{ij}$ is the time domain Green's function, Nport is the number of ports, $V_i'$ is a virtual source at each node, T is a time period in which all transients die out, and vt is a time step;
     (vii) returning the node voltage for all node sources from the subroutine to the general purpose circuit simulator;
   (c) performing a transient analysis to find a solution at each time q over the period T further comprising the steps of:
     (viii) passing time and voltage data from the general purpose circuit simulator to the subroutine and interpolating previous virtual source voltages to fit the time step;
     (ix) performing in the subroutine a circular convolution, $V_j(q)$, representing a sum of transient and steady state responses for each node at each time q according to:

$$V_j(q) = \sum_{i=1}^{Nport} \sum_{p=0}^{q} g_{ij}(q-p) V_i'(p) \Delta t + \sum_{p=q-T}^{-1} g_{ij}(-p) V_i'(0) \Delta t$$

(x) returning the node voltages from the subroutine to the general purpose circuit simulator; and
   (d) displaying the expected response.

11. The method of claim 10 further comprising the step of modeling a printed circuit board as a transmission line system.

12. The method of claim 10 further comprising the step of modeling termination characteristics of digital devices with non-linear transistor level models from the general purpose circuit simulator.

* * * * *